US010404210B1

(12) United States Patent
Lemay et al.

(10) Patent No.: US 10,404,210 B1
(45) Date of Patent: Sep. 3, 2019

(54) SUPERCONDUCTIVE CAVITY OSCILLATOR

(71) Applicant: SPAWAR Systems Center Pacific, San Diego, CA (US)

(72) Inventors: Lee Lemay, San Diego, CA (US); Eric Bozeman, La Mesa, CA (US); Kari Moran, San Diego, CA (US); Teresa Emery-Adleman, San Diego, CA (US); Anirudha Siripuram, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 9 days.

(21) Appl. No.: 15/969,316

(22) Filed: May 2, 2018

(51) Int. Cl.
*H03B 15/00* (2006.01)
*H03B 5/18* (2006.01)
*H01L 39/00* (2006.01)
*H01P 1/208* (2006.01)

(52) U.S. Cl.
CPC .......... *H03B 15/003* (2013.01); *H01P 1/208* (2013.01)

(58) Field of Classification Search
CPC .................................................. H03B 5/1817
USPC ..................................................... 331/107 DP
See application file for complete search history.

(56) References Cited

U.S. PATENT DOCUMENTS

| | | | | |
|---|---|---|---|---|
| 3,927,369 A * | 12/1975 | Billeter | ................... | G01K 5/52 |
| | | | | 324/642 |
| 4,028,651 A | 6/1977 | Leetmaa | | |
| 5,012,211 A | 4/1991 | Young et al. | | |
| 5,118,660 A | 6/1992 | Riebman | | |
| 7,402,963 B2 * | 7/2008 | Sliski | ................... | H05H 13/02 |
| | | | | 315/502 |
| 8,493,277 B2 | 7/2013 | Lam et al. | | |
| 2006/0097807 A1 * | 5/2006 | Mage | ................... | H01P 7/10 |
| | | | | 331/107 DP |
| 2008/0061908 A1 | 3/2008 | Nakanishi et al. | | |

OTHER PUBLICATIONS

Applications of Interferometric Signal Processing to Phase-Noise Reduction in Microwave Oscillators—IEEE TMTT, vol. 46, No. 10—Oct. 1998.

* cited by examiner

*Primary Examiner* — Joseph Chang
(74) *Attorney, Agent, or Firm* — Naval Information Warfare Center, Pacific; Kyle Eppele

(57) ABSTRACT

A cavity oscillator comprising: an amplifier operable to provide energy to a local oscillating signal; a superconducting resonant cavity arranged to receive the local oscillating signal and being operable to reflect a portion of the local oscillating signal for use in a feedback circuit, to support an electromagnetic wave related to the local oscillating signal in a desired TM mode, and to output a filtered signal of a desired frequency or frequencies based on the geometry of the cavity; a feedback circuit operable to generate an error signal based on the local oscillating signal and the reflected signal; and a phase shifter arranged operable to adjust the filtered signal based on the error signal to generate an adjusted filtered signal. The amplifier can amplify the adjusted filtered signal.

20 Claims, 7 Drawing Sheets

SUPERCONDUCTIVE CAVITY OSCILLATOR

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-3001; email: ssc_pac_t2@navy.mil. Reference Navy Case No. 106545.

BACKGROUND OF THE INVENTION

Embodiments of the invention relate to a clock signal generator.

Many systems, including communications networks, power grids, and financial networks, rely on their sub-systems being synchronized in time. In many cases, these systems use time distribution signals from the Global Positioning System (GPS) to provide time synchronization. GPS signals may be weak or jammed; critical systems must be able to maintain functionality in the absence of GPS, and thus require high-precision local clocks.

There exists a need for a high-precision clock with better performance than currently available rubidium or cesium clocks.

SUMMARY OF THE INVENTION

An aspect of the present invention is drawn to a cavity oscillator comprising: an amplifier operable to provide energy to a local oscillating signal; a superconducting resonant cavity arranged to receive the local oscillating signal and being operable to reflect a portion of the local oscillating signal for use in a feedback circuit, to support an electromagnetic wave related to the local oscillating signal in a desired TM mode, and to output a filtered signal of a desired frequency or frequencies based on the geometry of the cavity; a feedback circuit operable to generate an error signal based on the local oscillating signal and the reflected signal; and a phase shifter arranged operable to adjust the filtered signal based on the error signal to generate an adjusted filtered signal. The amplifier can amplify the adjusted filtered signal.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Aspects of the present invention provide a high-precision oscillator using a multi-chambered superconductive resonant cavity with a very high quality factor (Q).

Many systems around the world, including communications networks, power grids, financial networks, and others, rely on their sub-systems being synchronized in time. In many cases, these systems use time distribution from the Global Positioning System (GPS) to provide time synchronization. GPS signals, however, are weak and are easily jammed. Critical systems must be able to maintain functionality in the absence of GPS, and thus require high-precision local clocks.

Even the best clocks drift over time in the absence of synchronization. Currently, rubidium oscillators and cesium clocks have slow drift rates of about 1 µs/day and 1 ns/day, respectively. There exists a need for a high-precision clock with better performance than currently available clocks.

Aspects of the present invention will now be further described with reference to FIGS. 1-7.

Figure 1:
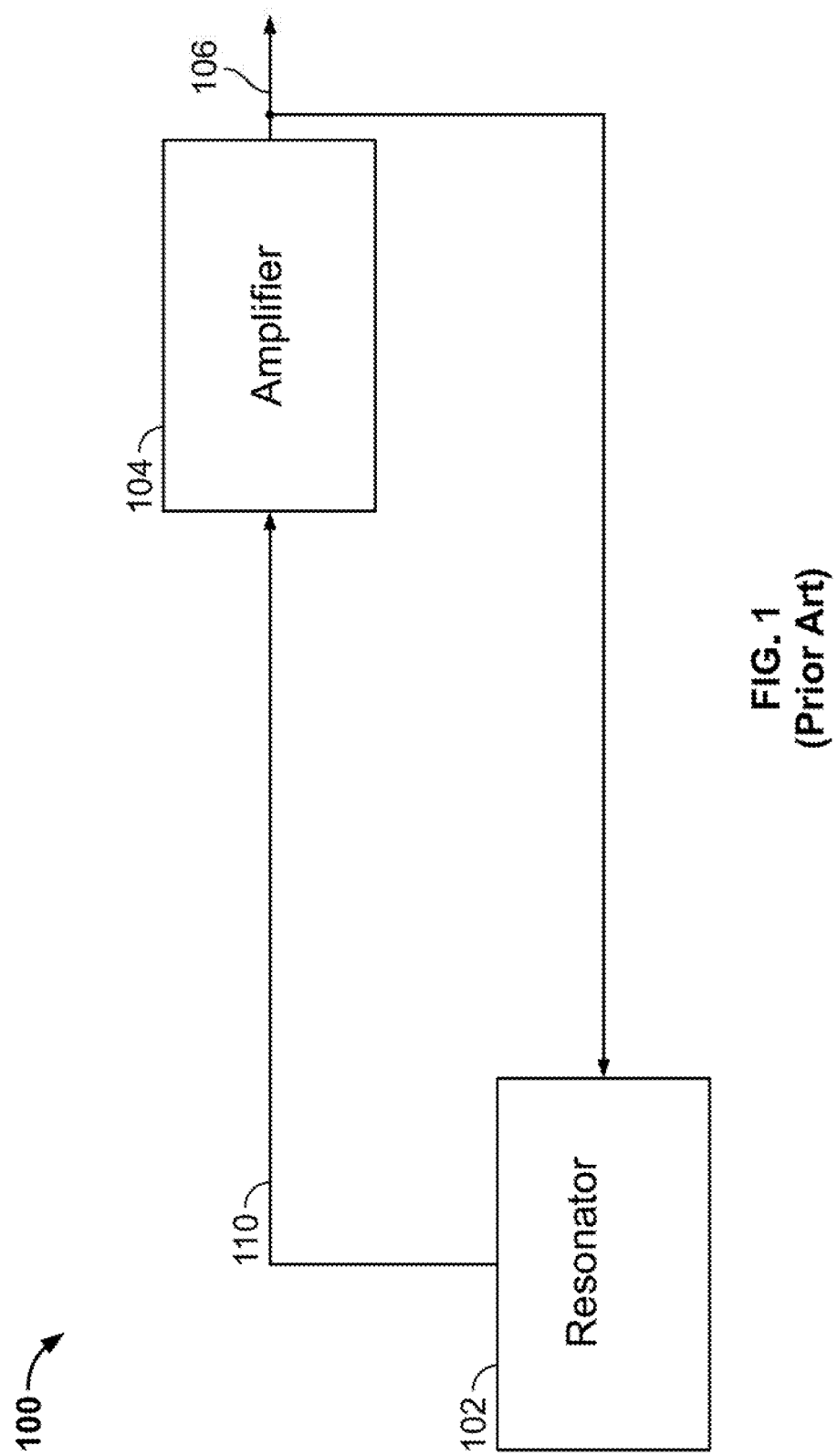
FIG. 1 illustrates a prior art oscillator circuit.

FIG. 1 illustrates a prior art oscillator circuit 100.

As shown in the figure, oscillator circuit 100 contains a resonator 102 and an amplifier 104. Amplifier 104 outputs an amplified signal 106, which feeds back into resonator 102. Amplified signal 106 may be used by external devices (not shown) as a clock signal.

Resonator 102 may be any superconducting device that resonates at specific frequencies when stimulated by electromagnetic waves. Resonator 102 filters amplified signal 106 and outputs filtered signal 110.

Amplifier 104 may be any device that increases the amplitude of an input signal.

Oscillator circuit 100 generates one or more resonant frequencies that are determined by characteristics of resonator 102 and amplifier 104.

Ideally, oscillator circuit 100 generates output signal 106 comprising a single frequency that is noiseless and perfectly stable. Due to noise and non-ideal components, the phase of output signal 106 tends to drift in time. When output signal 106 is used as an oscillator signal, to regulate other circuits, any drift in phase such a clock signal is undesirable. The performance of oscillator circuit 100 may be improved with the addition of a feedback control network, which will now be discussed with reference to FIG. 2.

Figure 2:
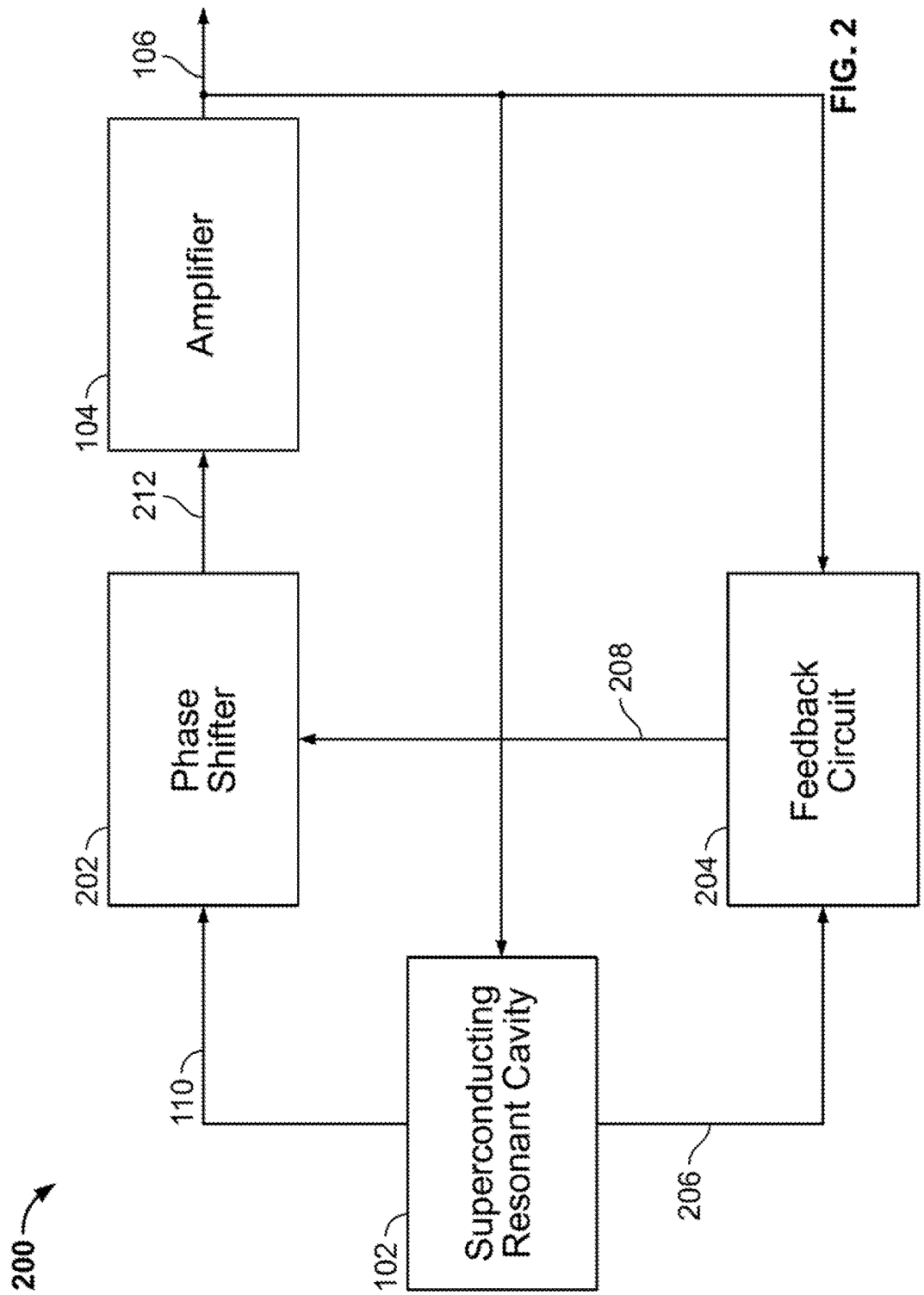
FIG. 2 illustrates a cavity oscillator in accordance with aspects of the current invention.

FIG. 2 illustrates cavity oscillator 200 in accordance with aspects of the present invention.

As shown in the figure, cavity oscillator 200 contains superconducting resonant cavity 102, amplifier 104, a phase shifter 202, and a feedback circuit 204. Feedback circuit 204 compares a reflected signal 206 with amplified signal 106 and generates an error signal 208. Error signal 208 is used by phase shifter 202 to adjust the phase, or delay, of an adjusted filtered signal 212 relative to filtered signal 110.

Phase shifter 202 may be any device or system that can vary the phase, or delay, of adjusted filtered signal 212 relative to filtered signal 110. A non-limiting example of phase shifter 202 is a voltage-controlled phase shifter that shifts the phase of its output 0° to 180° relative to its input, where the amount of phase shift is proportional to an input DC voltage.

Feedback circuit 204 may be any device or system that compares reflected signal 206 with amplified signal 106 and generates error signal 208 where error signal 208 is related to the phase difference between amplified signal 106 and reflected signal 206. In a non-limiting example, feedback circuit 204 contains a microwave interferometer circuit, a readout amplifier, and several microwave splitters and couplers. Reflected signal 206 is taken from an input port (not shown) of superconducting resonant cavity 102.

In operation, superconducting resonant cavity 102 acts as a filter with a sharp response around one or more resonant frequencies. Cavity oscillator 200 therefore oscillates at these resonant frequencies, with other frequencies being attenuated over time. Due to non-ideal characteristics of the electrical components used, cavity oscillator 200 will tend to drift in phase. In particular, amplified signal 106 exhibits increased noise when compared to reflected signal 206, which represents a filtered reference signal emitted from superconducting resonant cavity 102.

Feedback circuit 204 compares amplified signal 106 with reflected signal 206 and generates error signal 208. Phase shifter 202 uses error signal 208 to vary the phase of adjusted filtered signal 212, thus reducing the error between amplified signal 106 and reflected signal 206.

To increase the effectiveness of error signal 208, an ideal desired phase of output signal 110 should be used for reference. Reflected signal 206 from superconducting resonant cavity 102 provides this ideal desired phase.

FIG. 2 illustrates cavity oscillator 200. Aspects of superconducting resonant cavity 102 will now be discussed with reference to FIG. 3.

Figure 3:
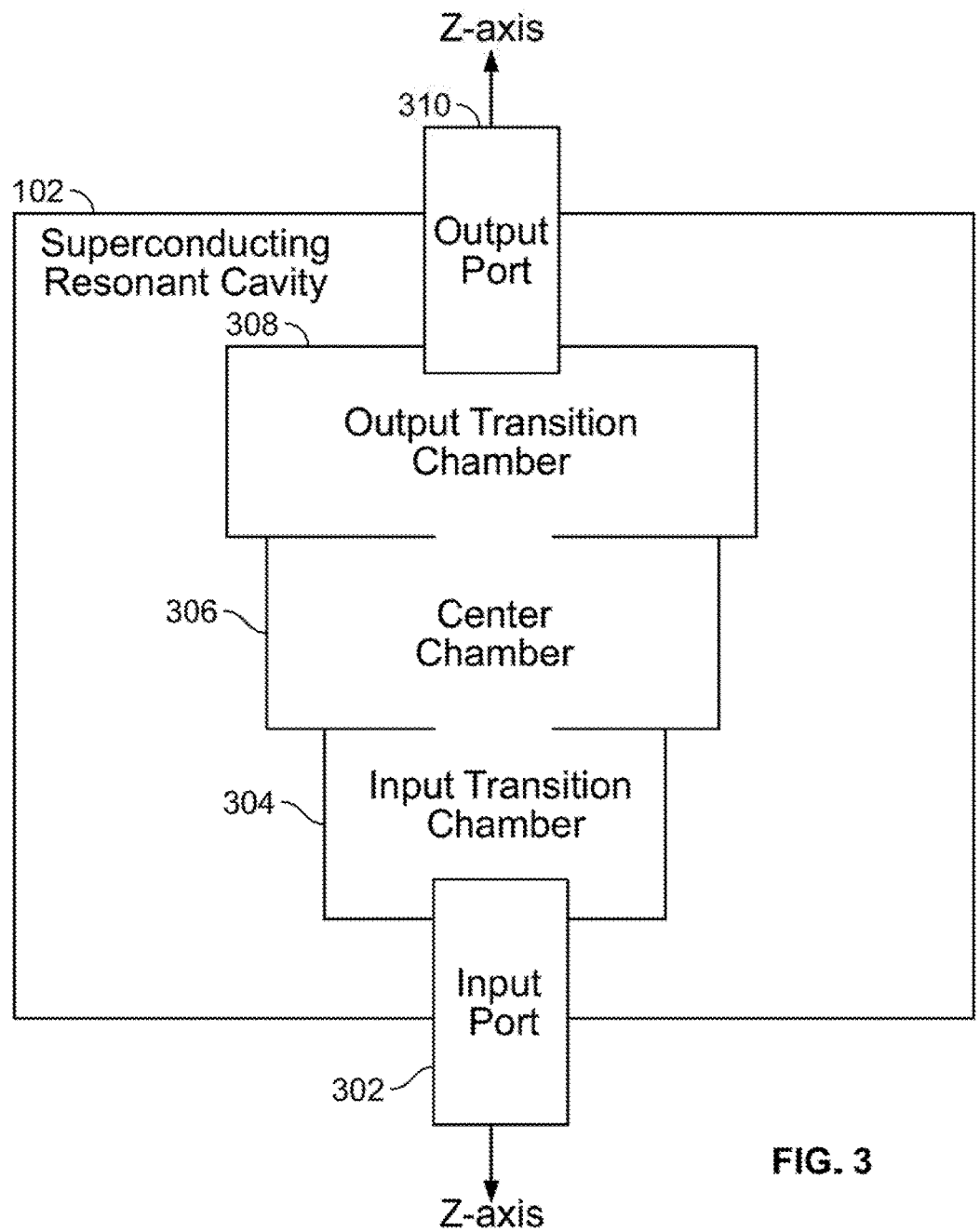
FIG. 3 illustrates a superconducting resonant cavity in accordance with aspects of the current invention.

FIG. 3 illustrates superconducting resonant cavity 102 in accordance with aspects of the present invention.

As shown in the figure, superconducting resonant cavity 102 contains input port 302, input transition chamber 304, center chamber 306, output transition chamber 308, and output port 310.

Input port 302 and output port 310 may be any devices or system that electrically connects superconducting resonant cavity 102 to other components of cavity oscillator 200. In this non-limiting example, input port 302 and output port 310 are coaxial connectors, each with an outer conductor surrounding an inner conductor. Further, a coaxial input cable (not shown) that is operable to receive the local oscillating signal is connected to superconducting resonant cavity 102 at input port 302 so as to provide the local oscillating signal to input port 302. Further, a coaxial output cable (not shown) that is operable to transmit a filtered output signal from superconducting resonant cavity 102 is connected to superconducting resonant cavity 102 at output port 310 so as to receive the filtered output signal from output port 310.

Input transition chamber 304, center chamber 306, and output transition chamber 308 may be any superconducting devices or structure capable of resonating at one or more frequencies with very high Q-factors. Input transition chamber 304, center chamber 306, and output transition chamber 308 have a predetermined respective size and shape so as to pass the desired frequency or frequencies from the portion of the local oscillating signal that is not reflected. In this non-limiting example, input transition chamber 304, center chamber 306, and output transition chamber 308 have a cylindrical shape, are machined from superconducting material and are disposed coaxially in series aligned with the "z" axis. Further, the radius of input transition chamber 304 is smaller than the radius of center chamber 306, which is smaller than the radius of output transition chamber 308.

In operation, basically, amplifier 104 adds energy to the local oscillating signal to prevent it from decaying due to impedances in the rest of cavity oscillator 200. Amplifier 104 will amplify all signals (not just the desired local oscillating signal), so superconducting resonant cavity 102 acts as a filter; only allowing the desired frequencies to pass through. This filtered signal is then fed back to amplifier 104. Part of the local oscillating signal that is fed into superconducting resonant cavity 102 is reflected back, and used for comparison in feedback circuit 204. The part of the local oscillating signal that is not reflected, is directed into input transition chamber 304 where several modes exist. Only electromagnetic energy in the $TMz_{01}$ mode is allowed to pass into center chamber 306 (this helps to increase the Q). In output transition chamber 308, the $TMz_{01}$ mode is transitioned back to energy that can be transmitted through a coaxial conductor, which is how the energy exits superconducting resonant cavity 102.

The desired resonant frequency of cavity oscillator 200 is determined by the shape and dimensions of center chamber 306. Each of the input transition chamber 304, the center chamber 306 and the output transition chamber 308 have a predetermined respective size and shape so as to pass the desired frequency, or frequencies, from the portion of the input local oscillating signal that is not reflected. Input transition chamber 304 supports plural TM modes. However, center chamber 306 supports a pure desired $TM_{01}$ mode. For purposes of discussion, in this example embodiment, center chamber 306 supports a pure $TM_{01}$ mode in the "z" axis, or a $TMz_{01}$ (Transverse Magnetic to the "z" axis) mode.

Input transition chamber 304 and output transition chamber 308 are used as transition chambers to couple energy into and through center chamber 306 from input port 302 and output port 310, respectively.

To reduce ohmic losses, input transition chamber 304, center chamber 306, and output transition chamber 308 may be fabricated from, or coated with, a superconducting material. In this non-limiting example, the superconducting material used is niobium, which is superconducting below ~9.3 K. In other example embodiments, other known superconducting materials may be used.

FIGS. 2-3 illustrate cavity oscillator 200 using superconducting resonant cavity 102 and amplifier 104, with phase shifter 202 and feedback circuit 204. Various aspects of superconducting resonant cavity 102 will now be discussed with reference to FIGS. 4-6.

Figure 4:
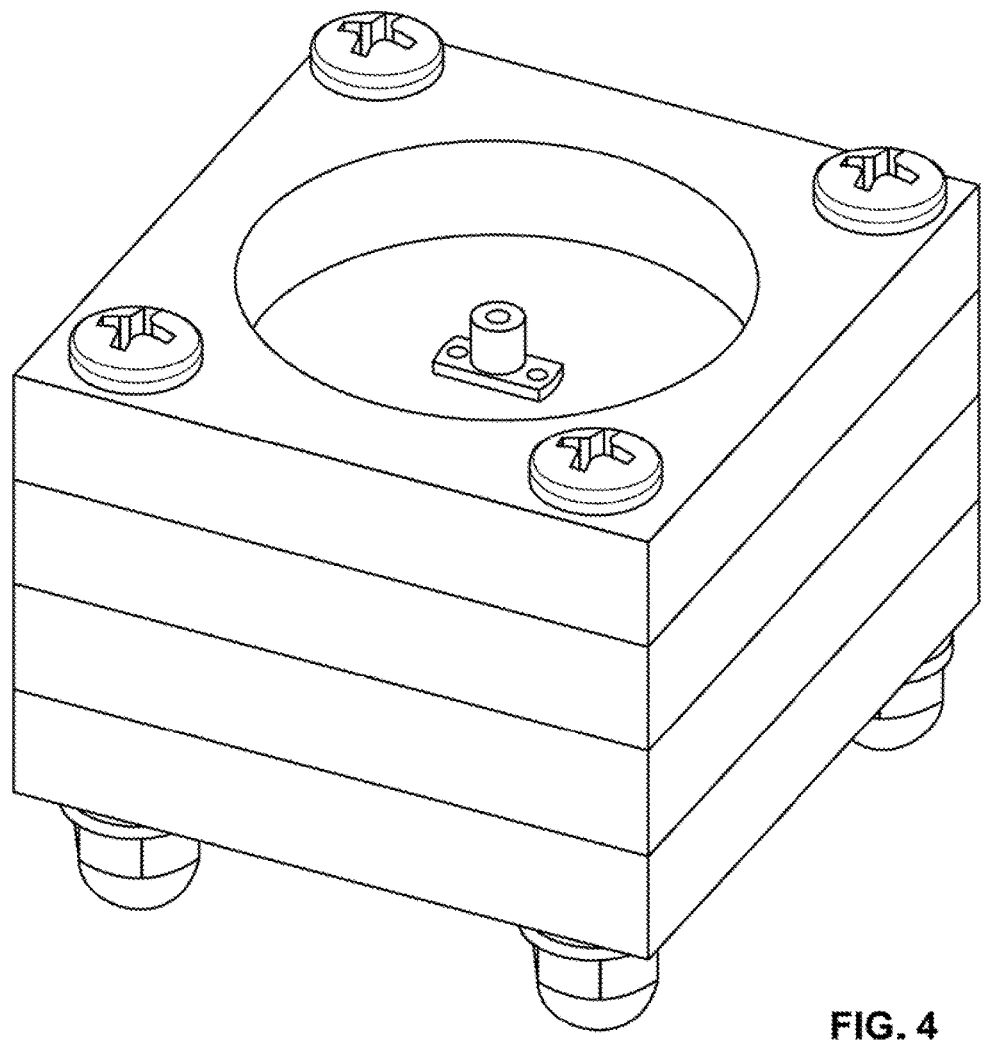
FIG. 4 illustrates a 3D model of a superconducting resonant cavity in accordance with aspects of the current invention.

FIG. 4 illustrates a 3D model of superconducting resonant cavity 102 in accordance with aspects of the current invention.

Figure 5:
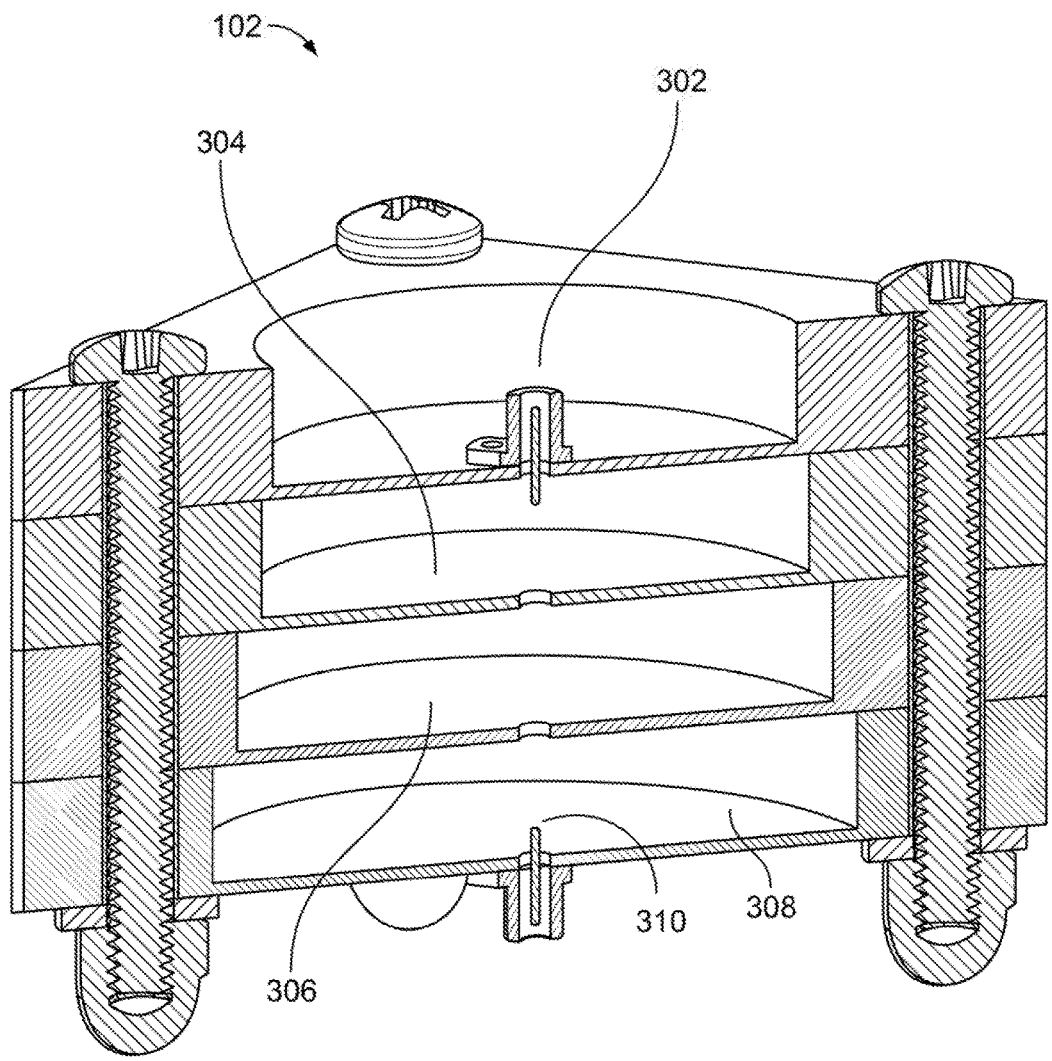
FIG. 5 illustrates a cross-section of a 3D model of a superconducting resonant cavity in accordance with aspects of the current invention.

FIG. 5 illustrates a cross-section of a 3D model of superconducting resonant cavity 102 in accordance with aspects of the current invention.

As shown in the figure, input transition chamber 304, center chamber 306, and output transition chamber 308 are separate components that are bolted together. In other example embodiments, input transition chamber 304, center chamber 306, and output transition chamber 308 may be separate components that are attached by other methods such as welding, or may be fabricated from a single block of material.

In this non-limiting example, input transition chamber 304, center chamber 306, and output transition chamber 308 are fabricated from homogenous blocks of superconducting material. However, only the inner surfaces of input transition chamber 304, center chamber 306, and output transition chamber 308 are required to be superconductive. In other example embodiments, a thin layer of superconducting material may be deposited on the inner surfaces of input transition chamber 304, center chamber 306, and output transition chamber 308, while the substrate of superconducting resonant cavity 102 may be composed of a different material.

Figure 6:
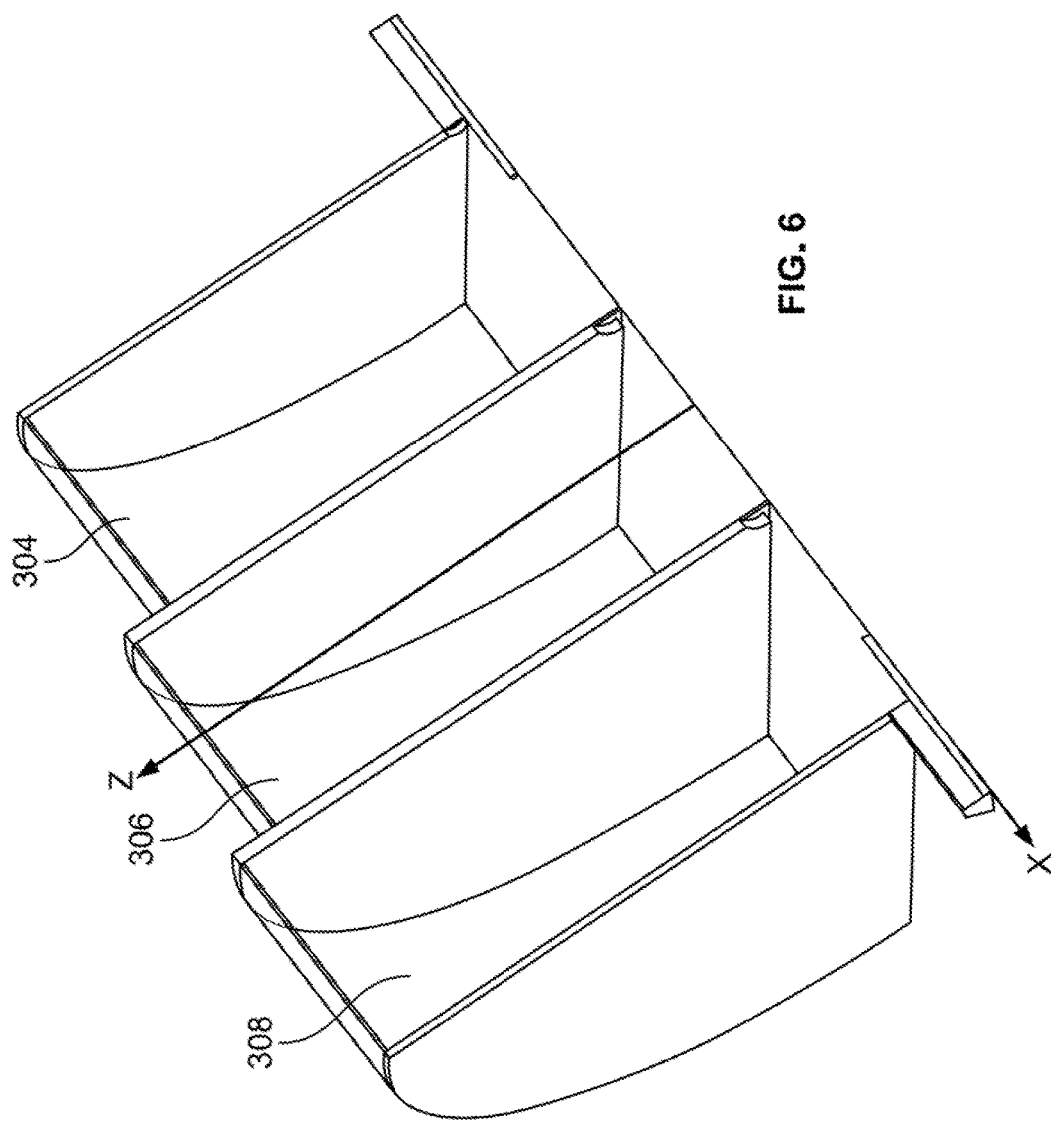
FIG. 6 illustrates a three-chambered cavity design in accordance with aspects of the current invention.

FIG. 6 illustrates a three-chambered cavity design of superconducting resonant cavity 102 in accordance with aspects of the present invention.

As shown in the figure, input transition chamber 304, center chamber 306, and output transition chamber 308 are cylindrical in shape, which is chosen for ease of design and manufacturing. In other example embodiments, input transition chamber 304, center chamber 306, and output transition chamber 308 may have non-cylindrical shapes and different dimensions, which may result in different operating frequencies and Q-factors.

A method of providing an oscillating signal in accordance with aspects of the present invention will now be described with reference to FIG. 7.

Figure 7:
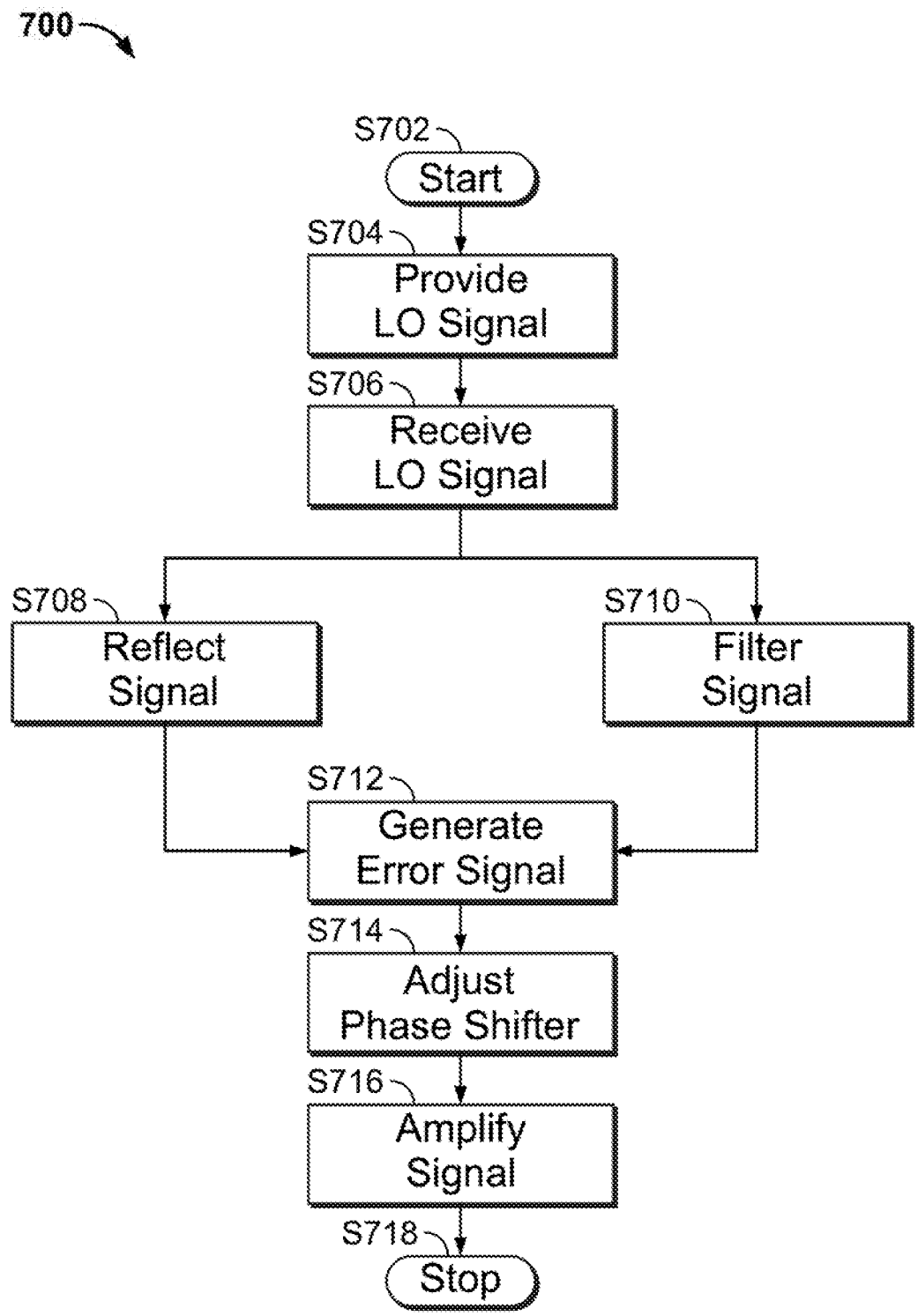
FIG. 7 illustrates a method of generating a signal from the cavity oscillator of FIG. 2 in accordance with aspects of the present invention.

FIG. 7 illustrates a method 700 of providing oscillating signal by way of cavity oscillator 200 in accordance with aspects of the present invention.

As shown in the figure, method 700 starts (S702) and a local oscillating (LO) signal is provided (S704). For example, returning to FIG. 2, as mentioned above, amplifier 104 outputs amplified signal 106 to superconducting resonant cavity 102.

Returning to FIG. 7, after the LO signal is provided (S704), the LO signal is received (S706). For example, as shown in FIG. 2, superconducting resonant cavity 102 receives amplified signal 106.

Returning to FIG. 7, after the LO signal is received (S706), a portion of the signal is reflected (S708). For example, returning to FIG. 2, superconducting resonant cavity 102 reflects a portion of amplified signal 106 to feedback circuit 204.

Returning to FIG. 7, additionally after the LO signal is received (S706), the remainder of the signal is filtered (S710). For example, returning to FIG. 2, while a portion of amplified signal 106 is reflected, superconducting resonant cavity 102 filters the remaining portion of amplified signal. This filtered portion is provided to phase shifter 202.

Returning to FIG. 7, after a portion of the LO signal is reflected (S708) and after the other portion of the LO signal is filtered (S710), an error signal is generated (S712). For example, returning to FIG. 2, the reflected signal provided by superconducting resonant cavity 102 and amplified signal 106 provided by amplifier 104 are provided to feedback circuit 204.

Returning to FIG. 7, after the error signal is generated (S712), the phase shifter is adjusted (S714). For example, returning to FIG. 2, feedback circuit 204 generates an error signal based on reflected signal provided by superconducting resonant cavity 102 and amplified signal 106 provided by amplifier 104. This error signal is provided to phase shifter 202.

Returning to FIG. 7, after the phase shifter is adjusted (S714), the signal is amplified (S716). For example, returning to FIG. 2, phase shifter 202 receives the filtered signal from superconducting resonant cavity 102 and receives the error signal from feedback circuit 204. Phase shifter 202 then generates adjusted filtered signal 212. Amplifier 104 then amplifies the adjusted filtered signal 212 to provide a new amplified signal 106.

Returning to FIG. 7, after the signal is amplified (S716), method 700 stops (S718).

In its simplest form, an aspect of the present invention is drawn to a combination of an amplifier and a superconducting resonant cavity that provides an oscillating signal. This is a positive feedback system, so the signal enters and exits both the amplifier and cavity. The amplifier adds energy to the system and allows the signal to grow. The cavity is part of the feedback network, and it filters out undesired signals/frequencies. The present invention differs from prior art resonant cavity and amplifier combinations in that the present invention includes a non-standard cavity design, based on superconductive material properties. This non-standard cavity design, based on superconductive material properties enables the creation of a precision oscillator.

In summary, many systems require accurate time synchronization across their sub-systems. In many cases, these systems rely on GPS signals in order to establish and maintain time synchronization. However, GPS signals may be jammed or too weak to receive; therefore, systems still require local oscillators in order to maintain functionality. Prior-art oscillators such as rubidium or cesium oscillators are accurate to about 1 µs/day and 1 ns/day, respectively.

The invention presents a system using a superconducting resonant cavity and a feedback circuit to create an oscillator that should drift by less than 1 ns/day and provide about 3 orders of magnitude greater short-term precision than currently-available atomic clocks.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A cavity oscillator comprising:
    an amplifier operable to provide energy to a local oscillating signal,
    a superconducting resonant cavity arranged to receive the local oscillating signal and being operable to reflect a reflected portion of the local oscillating signal as a reflected signal, to support an electromagnetic wave related to the local oscillating signal in a desired TM mode and to output a filtered signal of a desired frequency or frequencies based on the desired TM mode;
    a feedback circuit operable to generate an error signal based on the local oscillating signal and the reflected signal; and
    a phase shifter arranged operable to adjust the filtered signal based on the error signal to generate an adjusted filtered signal,
    wherein said amplifier being is further operable to amplify the adjusted filtered signal.

2. The cavity oscillator of claim 1,
    wherein said superconducting resonant cavity comprises an input transition chamber, a center chamber and an output transition chamber,
    wherein said center chamber is disposed between said input transition chamber and said output chamber, wherein said input transition chamber is operable to support plural TM modes, wherein said center chamber is operable to support the desired TM mode, and wherein each of said input transition chamber, said center chamber and said output transition chamber have a predetermined respective size and shape so as to pass the desired frequency or frequencies from a second portion of the local oscillating signal.

3. The cavity oscillator of claim 2, wherein said center chamber is operable to support the desired TM mode as a $TM_{01}$ mode.

4. The cavity oscillator of claim 3, wherein said input transition chamber, said center chamber and said output transition chamber have a cylindrical shape and are coaxially arranged.

5. The cavity oscillator of claim 4, wherein said input transition chamber has a first radius, wherein center chamber has a second radius that is greater than said first radius, and wherein said output chamber has a third radius that is greater than said second radius.

6. The cavity oscillator of claim 5, wherein said superconducting resonant cavity comprises niobium.

7. The cavity oscillator of claim 6, further comprising:

an input port electrically connected to said input transition chamber;

an output port electrically connected to said output transition chamber;

a coaxial input cable operable to receive the local oscillating signal and electrically connected to said input port so as to provide the local oscillating signal to said input port; and a coaxial output cable electrically connected to said output port so as to receive the filtered output signal from said output port.

8. The cavity oscillator of claim 2, wherein said input transition chamber, said center chamber and said output transition chamber have a cylindrical shape and are coaxially arranged.

9. The cavity oscillator of claim 8, wherein said input transition chamber has a first radius, wherein center chamber has a second radius that is greater than said first radius, and wherein said output chamber has a third radius that is greater than said second radius.

10. The cavity oscillator of claim 9, wherein said superconducting resonant cavity comprises niobium.

11. The cavity oscillator of claim 10, further comprising:

an input port electrically connected to said input transition chamber;

an output port electrically connected to said output transition chamber;

a coaxial input cable operable to receive the local oscillating signal and electrically connected to said input port so as to provide the local oscillating signal to said input port; and a coaxial output cable electrically connected to said output port so as to receive the filtered output signal from said output port.

12. The cavity oscillator of claim 1, wherein said superconducting resonant cavity comprises niobium.

13. The cavity oscillator of claim 12, further comprising:

an input port electrically connected to said superconducting resonant cavity;

an output port electrically connected to said superconducting resonant cavity;

a coaxial input cable operable to receive the local oscillating signal and electrically connected to said input port so as to provide the local oscillating signal to said input port; and a coaxial output cable electrically connected to said output port so as to receive the filtered output signal from said output port, wherein said superconducting resonant cavity has a superconducting resonant cavity input port and a superconducting resonant cavity output port, wherein said input port is electrically connected to said superconducting resonant cavity input port, and wherein said output port is electrically connected to said superconducting resonant cavity output port.

14. The cavity oscillator of claim 1, further comprising:

an input port electrically connected to said superconducting resonant cavity;

an output port electrically connected to said superconducting resonant cavity;

a coaxial input cable operable to receive the local oscillating signal and electrically connected to said input port so as to provide the local oscillating signal to said input port; and a coaxial output cable electrically connected to said output port so as to receive the filtered output signal from said output port, wherein said superconducting resonant cavity has a superconducting resonant cavity input port and a superconducting resonant cavity output port, wherein said input port is electrically connected to said superconducting resonant cavity input port, and wherein said output port is electrically connected to said superconducting resonant cavity output port.

15. A method comprising:

providing, via an amplifier, a local oscillating signal, receiving, at a superconducting resonant cavity, the local oscillating signal, the superconducting resonant cavity being operable to support an electromagnetic wave related to the local oscillating signal in a desired TM mode;

reflecting, from the superconducting resonant cavity, a reflected portion of the local oscillating signal as a reflected signal;

outputting, from the superconducting resonant cavity, a filtered signal of a desired frequency or frequencies based on the desired TM mode;

generating, via a feedback circuit, an error signal based on the local oscillating signal and the reflected signal;

adjusting, via a phase shifter, the filtered signal based on the error signal to generate an adjusted filtered signal; and amplifying, via the amplifier, the adjusted filtered signal.

16. The method claim 15, wherein said receiving, at a superconducting resonant cavity, the local oscillating signal comprises receiving, at the superconducting resonant cavity comprising an input transition chamber, a center chamber and an output transition chamber, wherein the center chamber is disposed between the input transition chamber and the output chamber, wherein the input transition chamber is operable to support plural TM modes, wherein the center chamber is operable to support the desired TM mode, and wherein each of the input transition chamber, the center chamber and the output transition chamber have a predetermined respective size and shape so as to pass the desired frequency or frequencies from the input local oscillating signal.

17. The method of claim 16, wherein said receiving, at a superconducting resonant cavity, the local oscillating signal comprises receiving at the superconducting resonant cavity having the center chamber to be operable to support the desired TM mode as a $TM_{01}$ mode.

18. The method of claim 17, wherein said receiving, at a superconducting resonant cavity, the local oscillating signal comprises receiving at the superconducting resonant cavity having the input transition chamber, the center chamber and the output transition chamber to have a cylindrical shape and to be coaxially arranged.

19. The method of claim 18,
wherein the input transition chamber has a first radius,
wherein center chamber has a second radius that is greater than the first radius, and wherein the output chamber has a third radius that is greater than the second radius.

20. A cavity oscillator comprising:
an amplifier operable to provide energy to a local oscillating signal;
a superconducting resonant cavity arranged to receive the local oscillating signal and being operable to reflect a portion of the local oscillating signal for use in a feedback circuit, to support an electromagnetic wave related to the local oscillating signal in a desired TM mode, and to output a filtered signal of a desired frequency or frequencies based on a geometry of the cavity;
a feedback circuit operable to generate an error signal based on the local oscillating signal and the reflected signal; and
a phase shifter arranged operable to adjust the filtered signal based on the error signal to generate an adjusted filtered signal,
wherein said amplifier being is further operable to amplify the adjusted filtered signal, and
wherein said superconducting resonant cavity comprises three chambers.

* * * * *